US009923167B2

(12) United States Patent
Choi et al.

(10) Patent No.: US 9,923,167 B2
(45) Date of Patent: *Mar. 20, 2018

(54) ORGANIC LIGHT-EMITTING DISPLAY APPARATUS AND METHOD OF MANUFACTURING THE SAME

(71) Applicant: SAMSUNG DISPLAY CO., LTD., Yongin-si, Gyeonggi-do (KR)

(72) Inventors: Youngseo Choi, Yongin-si (KR); Jinho Kwak, Yongin-si (KR); Jaeho Lee, Yongin-si (KR); Dongwon Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/879,044

(22) Filed: Oct. 8, 2015

(65) Prior Publication Data

US 2016/0260928 A1 Sep. 8, 2016

(30) Foreign Application Priority Data

Mar. 6, 2015 (KR) .................. 10-2015-0031970

(51) Int. Cl.
*H01L 29/08* (2006.01)
*H01L 51/52* (2006.01)
*H01L 27/32* (2006.01)

(52) U.S. Cl.
CPC ...... *H01L 51/5253* (2013.01); *H01L 27/3246* (2013.01); *H01L 27/3258* (2013.01); *H01L 2251/558* (2013.01)

(58) Field of Classification Search
CPC .......... H01L 2227/323; H01L 27/3246; H01L 27/3248; H01L 51/5256; H01L 51/56
USPC ....................... 257/40, 88, 83, 678
See application file for complete search history.

(56) References Cited

U.S. PATENT DOCUMENTS

| 9,595,573 B2* | 3/2017 | Adachi | H01L 27/3246 |
|---|---|---|---|
| 2003/0203210 A1 | 10/2003 | Graff et al. | |
| 2009/0179566 A1 | 7/2009 | Imamura | |
| 2011/0291116 A1* | 12/2011 | Kang | H01L 51/56 257/88 |
| 2012/0133275 A1 | 5/2012 | Lee et al. | |
| 2014/0217371 A1 | 8/2014 | Kim et al. | |

(Continued)

FOREIGN PATENT DOCUMENTS

| JP | 2008-165251 A | 7/2008 |
|---|---|---|
| KR | 10-0777746 B1 | 11/2007 |

(Continued)

*Primary Examiner* — Mohammed Shamsuzzaman
(74) *Attorney, Agent, or Firm* — Lewis Roca Rothgerber Christie LLP

(57) ABSTRACT

An organic light-emitting display apparatus includes a substrate, a display on the substrate, a dam outside the display and spaced from the display, the dam having a stacked multi-layer structure and having a first side surface that faces the display, a second side surface opposite to the display, and a top, a groove in a separation area between the display and the dam, and an encapsulation layer that includes a first inorganic layer and an organic layer on the first inorganic layer, the first inorganic layer covering the display and extending along an inner surface of the groove, and an end of the organic layer being contained in the groove.

10 Claims, 6 Drawing Sheets

(56) References Cited

U.S. PATENT DOCUMENTS

2015/0171367 A1* 6/2015 Moon ............... H01L 51/5253
                                                    257/40
2015/0380685 A1* 12/2015 Lee .................. H01L 51/5243
                                                    257/40
2016/0285038 A1* 9/2016 Kim .................. H01L 51/5237

FOREIGN PATENT DOCUMENTS

| KR | 10-2011-0130925 A | 12/2011 |
| KR | 10-2012-0057286 A | 6/2012 |
| KR | 10-2014-0100733 A | 8/2014 |

* cited by examiner

ORGANIC LIGHT-EMITTING DISPLAY APPARATUS AND METHOD OF MANUFACTURING THE SAME

CROSS-REFERENCE TO RELATED APPLICATION

This application claims priority to and the benefit of Korean Patent Application No. 10-2015-0031970, filed on Mar. 6, 2015, in the Korean Intellectual Property Office, the disclosure of which is incorporated herein in its entirety by reference.

BACKGROUND

1. Field

One or more exemplary embodiments relate to an organic light-emitting display apparatus and a method of manufacturing the same.

2. Description of the Related Art

Because organic light-emitting display apparatuses have wide viewing angles, good contrast, and fast response times, the organic light-emitting display apparatuses are attracting much attention as next-generation display apparatuses.

Generally, in an organic light-emitting display apparatus, a plurality of thin film transistors (TFTs) and a plurality of organic light-emitting devices are formed on a lower substrate, and the organic light-emitting devices self-emit light. The organic light-emitting display apparatus may be used as a display of a small product such as a portable terminal and as a display of a large product such as a TV.

The organic light-emitting devices are vulnerable to external moisture and oxygen. Therefore, an encapsulation layer is formed on an organic light-emitting device, thereby covering the organic light-emitting device, and protecting the organic light-emitting device from external moisture and oxygen.

However, in a typical organic light-emitting display apparatus and a method of manufacturing the same, because a thickness of an encapsulation layer covering an organic light-emitting device is insufficient, cracks occur in the encapsulation layer due to particle-type impurities flowing from the outside, and external moisture and oxygen penetrate into a display through the cracks. As such, a defect rate of an organic light-emitting display apparatus increases, and a service life of the organic light-emitting display apparatus is shortened.

SUMMARY

One or more exemplary embodiments include an organic light-emitting display apparatus with an enhanced sealing force and a method of manufacturing the same.

Additional aspects will be set forth in part in the description which follows and, in part, will be apparent from the description, or may be learned by practice of the presented embodiments.

According to one or more exemplary embodiments of the present invention, an organic light-emitting display apparatus includes: a substrate; a display on the substrate; a dam outside the display and spaced from the display, the dam having a stacked multi-layer structure and having a first side surface that faces the display, a second side surface opposite to the display, and a top; a groove in a separation area between the display and the dam; and an encapsulation layer that includes a first inorganic layer and an organic layer on the first inorganic layer, the first inorganic layer covering the display and extending along an inner surface of the groove, and an end of the organic layer being contained in the groove.

A first portion of the first inorganic layer may cover the first side surface of the dam, a second portion of the first inorganic layer may cover the second side surface of the dam, and a third portion of the first inorganic layer may cover the top of the dam.

The organic light-emitting display apparatus may further include a second inorganic layer on the organic layer, wherein a first portion of the second inorganic layer may be on the second portion of the first inorganic layer and a second portion of the second inorganic layer may be on the third portion of the first inorganic layer.

A top of the organic layer may be substantially flat.

The dam may include a recessed portion at the top of the dam.

The organic layer may not be on the second side surface of the dam.

The organic light-emitting display apparatus may further include: a metal layer on a side of the display, the metal layer being configured to supply power to the display; and an insulation layer under the metal layer, wherein the separation area may expose the metal layer or the insulation layer.

The display may include: a thin film transistor on the substrate; a pixel electrode electrically connected to the thin film transistor; a pixel definition layer that covers an edge of the pixel electrode and exposes a portion of the pixel electrode; an intermediate layer on the pixel electrode, the intermediate layer including an emission layer; and an opposite electrode opposite to the pixel electrode. The dam may include:

a first layer extending in a direction parallel to a plane of the substrate and including an organic insulation material; and a second layer on the first layer and including a material that is the same as a material of the pixel definition layer.

A height of the dam from a top of the substrate to the top of the dam may be greater than a height from the top of the substrate to a bottom of the pixel definition layer.

A first portion of the organic layer at the pixel definition layer may have a first thickness, a second portion of the organic layer at the separation area may have a second thickness, and a third portion of the organic layer at an edge of the display without the pixel definition layer thereon may have a third thickness, and the third thickness may be greater than the first thickness and less than the second thickness.

The organic light-emitting display apparatus may further include an insulation layer that covers the thin film transistor and planarizes a top of the thin film transistor, wherein the pixel definition layer may be on the insulation layer, a first portion of the organic layer at the pixel definition layer may have a first thickness, a second portion of the organic layer at the separation area may have a second thickness, and a third portion of the organic layer on the insulation layer at an edge of the display may have a third thickness, and the third thickness may be greater than the first thickness and less than the second thickness.

According to one or more exemplary embodiments, a method of manufacturing an organic light-emitting display apparatus includes: forming a display on a substrate; forming a dam outside the display, the dam being spaced apart from the display and having a stacked multi-layer structure; and forming an encapsulation layer, the encapsulation layer including: a first inorganic layer covering the display and extending along an inner surface of a groove; and an organic layer on the first inorganic layer, wherein the groove is at a separation area between the display and the dam, wherein an end of the organic layer is contained in the groove, and wherein the dam has a first side surface that faces the display, a second side surface opposite to the display, and a top.

A first portion of the first inorganic layer may cover the first side surface of the dam, a second portion of the first inorganic layer may cover the second side surface of the dam, and a third portion of the first inorganic layer may cover the top of the dam.

The forming of the encapsulation layer may include forming a second inorganic layer on the organic layer, and a first portion of the second inorganic layer may be on the second portion of the first inorganic layer and a second portion of the second inorganic layer may be on the third portion of the first inorganic layer.

A top of the organic layer may be substantially flat.

The method may further include: forming a metal layer on a side of the display, the metal layer being configured to supply power to the display; and forming an insulation layer under the metal layer, wherein the separation area may expose the metal layer or the insulation layer.

The forming of the display may include: forming a thin film transistor on the substrate; forming a pixel electrode that is electrically connected to the thin film transistor; forming a pixel definition layer, which covers an edge of the pixel electrode and exposes a portion of the pixel electrode; forming an intermediate layer on the pixel electrode, the intermediate layer including an emission layer; and forming an opposite electrode opposite to the pixel electrode. The forming of the dam may include: forming a first layer that extends in a direction parallel to a plane of the substrate and including an organic insulation material; and forming a second layer on the first layer, the second layer including a material that is the same as a material of the pixel definition layer, the second layer and the pixel definition layer being formed concurrently.

A height of the dam from a top of the substrate to the top of the dam may be greater than a height from the top of the substrate to a bottom of the pixel definition layer.

A first portion of the organic layer at the pixel definition layer may have a first thickness, a second portion of the organic layer at the separation area may have a second thickness, and a third portion of the organic layer at an edge of the display without the pixel definition layer thereon may have a third thickness, and the third thickness may be greater than the first thickness and less than the second thickness.

The forming of the display and the forming of the dam may be concurrently performed.

In addition to the aforesaid details, other aspects and features will be clarified from the following drawings, claims, and detailed description.

These general and specific embodiments may be implemented by using a system, a method, a computer program, or a combination of the system, the method, and the computer program.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1:
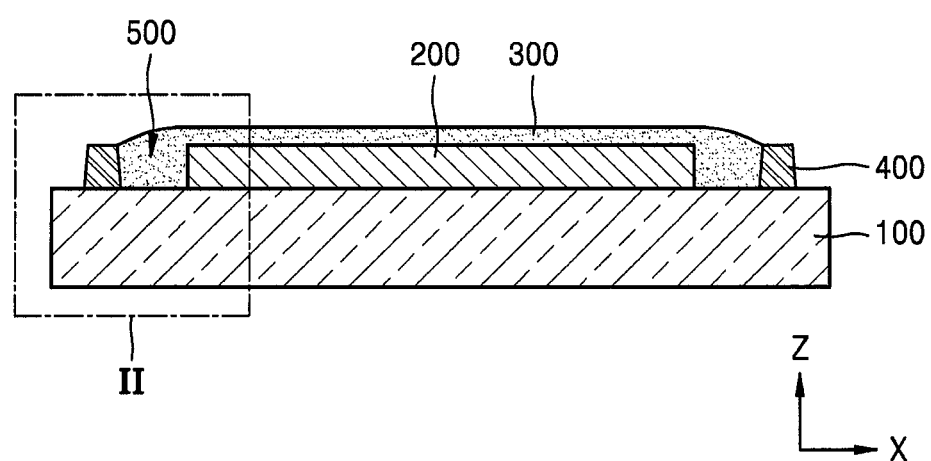
FIG. 1 is a cross-sectional view schematically illustrating an organic light-emitting display apparatus according to one or more exemplary embodiments.

Reference is now made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description.

Since the inventive concept may have diverse modified embodiments, example embodiments are illustrated in the drawings and are described in the detailed description of the inventive concept. The features and aspects of the inventive concept will become apparent from the following description of the embodiments with reference to the accompanying drawings, which is set forth hereinafter. The inventive concept may, however, be embodied in different forms and should not be construed as limited to the embodiments set forth herein.

The terminology used herein is for the purpose of describing particular embodiments and is not intended to be limiting of the inventive concept.

It will be understood that although the terms "first", "second", etc. may be used herein to describe various components, these components should not be limited by these terms. These terms are only used to distinguish one component from another. The terms of a singular form may include plural forms unless referred to the contrary.

The meaning of 'comprise', 'include', or 'have' specifies a property, a region, a fixed number, a step, a process, an element and/or a component but does not exclude other properties, regions, fixed numbers, steps, processes, elements and/or components. In the following embodiments, when an element such as a layer or a region is referred to as being "on", "connected to" or "adjacent to" another element, it can be directly on, connected to, or adjacent to the other element or layer, or one or more intervening elements or layers may be present. When an element or layer is referred to as being "directly on," "directly connected to", or "immediately adjacent to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

As used herein, the terms "substantially," "about," and similar terms are used as terms of approximation and not as terms of degree, and are intended to account for the inherent variations in measured or calculated values that would be recognized by those of ordinary skill in the art.

Sizes of elements in the drawings may be exaggerated for convenience of explanation. In other words, because sizes and thicknesses of components in the drawings may be arbitrarily illustrated for convenience of explanation, the following embodiments are not limited thereto. Spatially relative terms, such as "below," "lower," "bottom," "above," "upper," "top," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" other elements or features would then be oriented "above" the other elements or features. Thus, the example term "below" can encompass both an orientation of above and below. The device may be otherwise oriented (e.g., rotated 90 degrees or at other orientations) and the spatially relative descriptors used herein should be interpreted accordingly.

In the following examples, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

FIG. 1 is a cross-sectional view schematically illustrating an organic light-emitting display apparatus according to one or more exemplary embodiments of the present invention.

Referring to FIG. 1, the organic light-emitting display apparatus according to one or more exemplary embodiments of the present invention may include a substrate 100, a display 200 disposed on the substrate 100, an encapsulation layer 300 disposed on the display 200, a dam (or barrier) 400 disposed outside of the display 200, and a groove 500 at a separation area SA between the display 200 and the dam 400.

The substrate 100 may be formed of various materials such as a glass material, a metal material, etc. Alternatively, the substrate 100 may have a flexible characteristic, and therefore, the substrate 100 may be formed of one or more of various suitable materials such as a metal material and plastic materials such as, for example, polyethylene terephthalate (PET), polyethylene naphthalate (PEN), polyimide, etc. The substrate 100 may include a display area DA in which the display 200 is disposed and a peripheral area PA which surrounds (or encircles) the display area DA (e.g., surrounds the display area DA in a plane). The display 200 may include a plurality of organic light-emitting devices OLED. The display 200 may be disposed on the substrate 100 and may include the plurality of organic light-emitting devices OLED. In one or more exemplary embodiments, the display 200 may be an organic light-emitting display that includes a plurality of thin film transistors TFT and a plurality of pixel electrodes 210 (see FIG. 2) respectively connected thereto, but the display 200 is not limited thereto. For example, the display 200 may be an organic light-emitting display or may be a liquid crystal display. A detailed structure of the display 200 according to one or more embodiments of the present invention is described further below with reference to FIGS. 2 and 3.

The encapsulation layer 300 may be disposed on the display 200 to cover the display 200. That is, the encapsulation layer 300 may cover a top of the display 200 and may seal the organic light-emitting device OLED, and at least one portion of the encapsulation layer 300 may be disposed adjacent to the substrate 100. The encapsulation layer 300 may be formed in a multi-layer structure where an organic layer and an inorganic layer are stacked, thereby enhancing a sealing force.

The dam 400 may be disposed outside the display 200 and separated from the display 200 (e.g., may be separated from the display 200 by a predetermined distance). The separation area SA may be formed between the dam 400 and the display 200, and the groove 500 may be formed in the separation area SA. At least one portion of the encapsulation layer 300 may be buried or contained in the groove 500.

Figure 2:
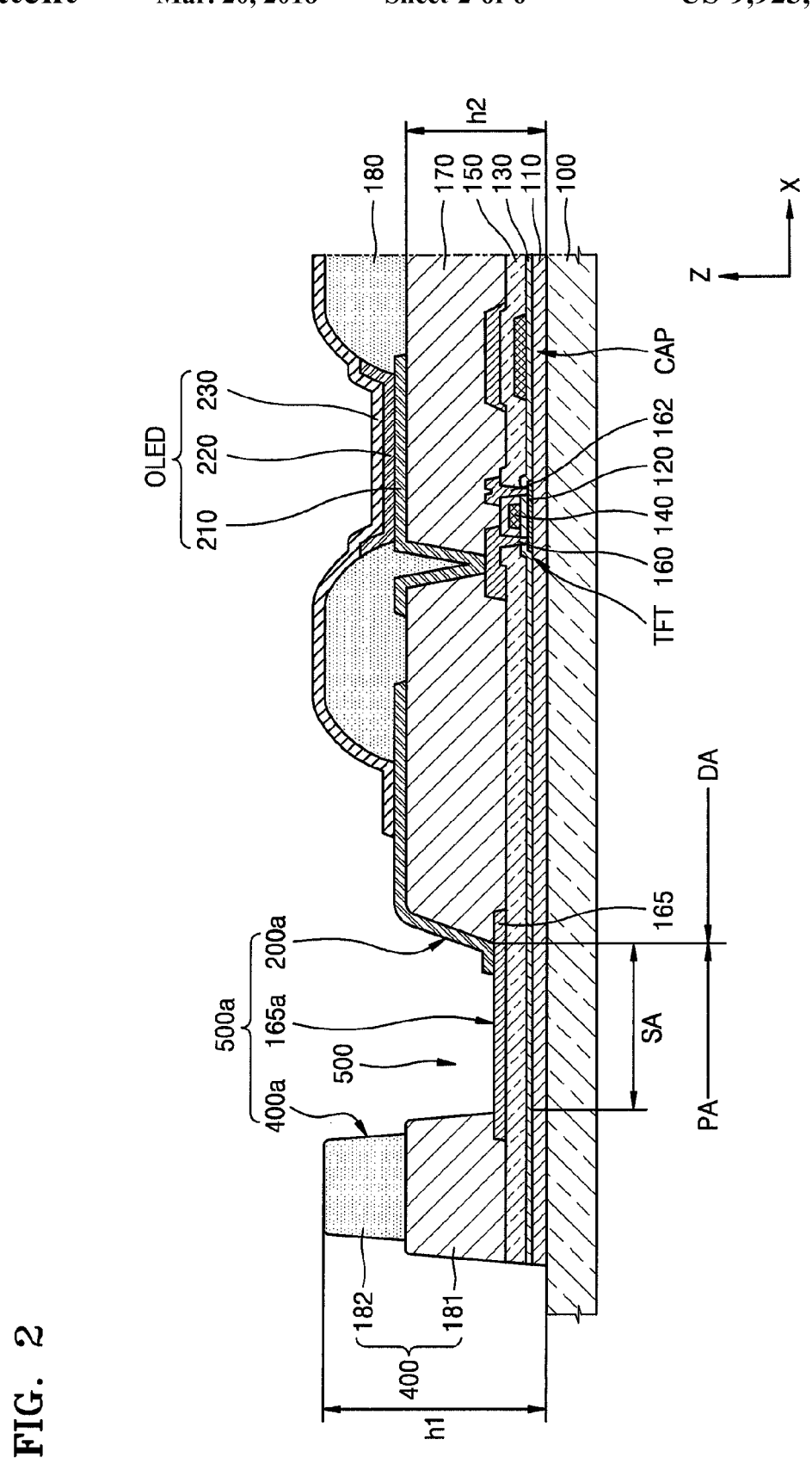
FIG. 2 is an enlarged cross-sectional view schematically illustrating a structure in region II of FIG. 1 in which an encapsulation layer is excluded.
Figure 3:
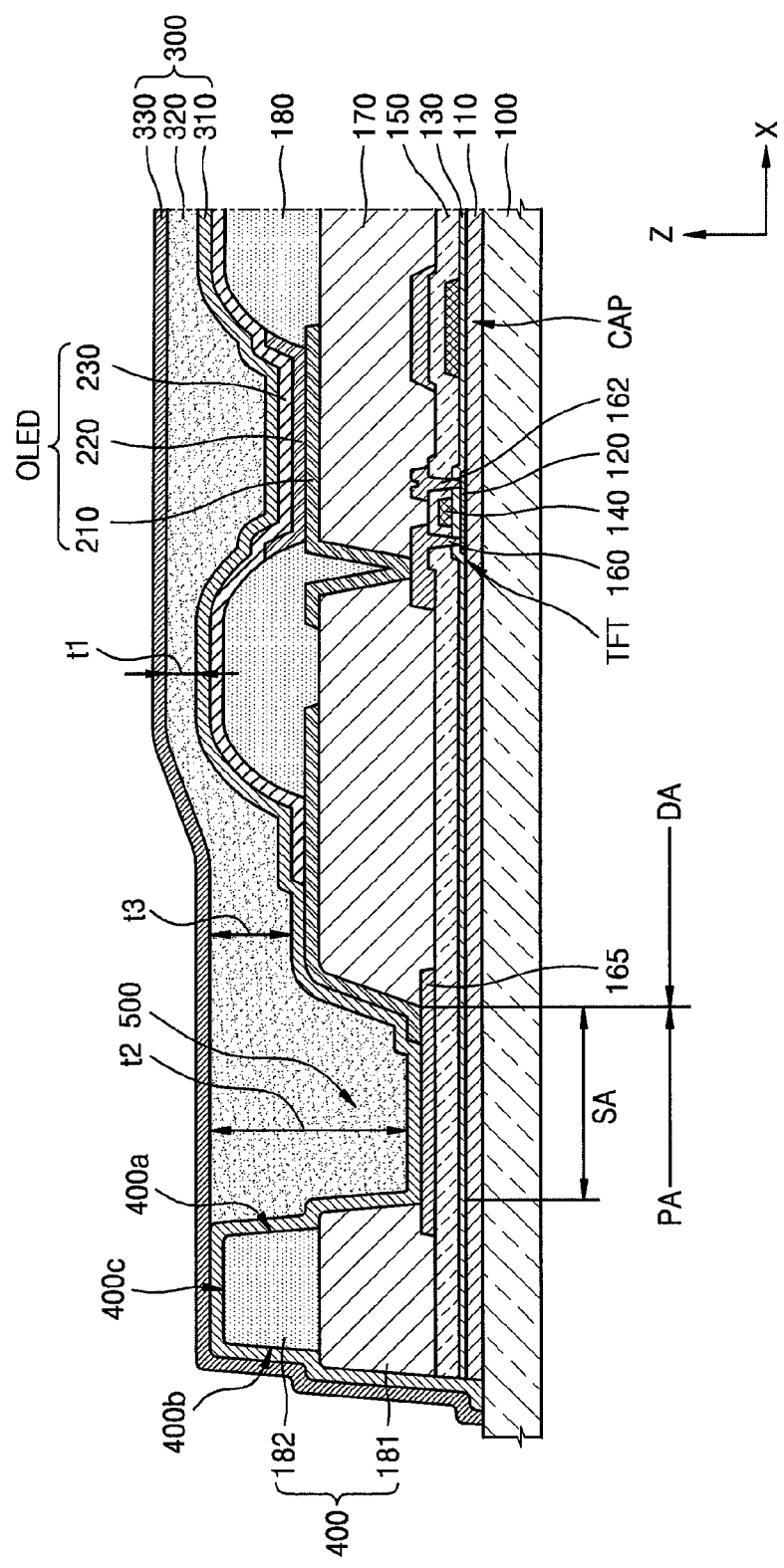
FIG. 3 is an enlarged cross-sectional view schematically illustrating a structure in region II of FIG. 1 in which the encapsulation layer is included.

FIG. 2 is an enlarged cross-sectional view schematically illustrating a structure in region II of FIG. 1 in which the encapsulation layer 300 is excluded. FIG. 3 is an enlarged cross-sectional view schematically illustrating a structure in region II of FIG. 1 in which the encapsulation layer 300 is included.

FIG. 2 illustrates a structure of each of the display 200 and the dam 400 but not the encapsulation layer 300 of the organic light-emitting display apparatus of FIG. 1. According to one or more exemplary embodiments of the present invention, the display 200 may be disposed in the display area DA of the substrate 100. A general structure of the display 200 is described below with reference to FIG. 2.

The display 200 may include a thin film transistor TFT and a capacitor CAP, and an organic light-emitting device OLED that is electrically connected to the thin film transistor TFT may be disposed in the display 200. The thin film transistor TFT may include a semiconductor layer 120, a gate electrode 140, a source electrode 160, and a drain electrode 162. The semiconductor layer may include amorphous silicon, polycrystalline silicon, and/or an organic semiconductor material, for example. A general configuration of the thin film transistor TFT is described further below.

A buffer layer 110 may be disposed on the top of the substrate 100 and may be provided for planarizing a surface of the substrate 100 or preventing impurities from penetrating into the thin film transistor TFT or the organic light-emitting device OLED, which are included in the display 200 disposed on the substrate 100. The buffer layer 110 may include a single layer or layers of a material such as silicon oxide and/or silicon nitride. The semiconductor layer 120 may be disposed on the buffer layer 110.

The gate electrode 140 may be disposed on the semiconductor layer 120, and the source electrode 160 may be electrically connected to the drain electrode 162 according to a signal applied to the gate electrode 140. The gate electrode 140 may include a single layer or layers of, for example, one or more materials selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu) by taking into account adhesiveness to a layer adjacent thereto, a surface flatness of a stacked layer, and processability.

In order to secure insulation between the semiconductor layer 120 and the gate electrode 140, a gate insulation layer 130, formed of silicon oxide and/or silicon nitride, may be disposed between the semiconductor layer 120 and the gate electrode 140.

An interlayer insulation layer 150 may be disposed on the gate electrode 140 and may include a single layer or layers of a material such as silicon oxide and/or silicon nitride, for example.

The source electrode 160 and the drain electrode 162 may be disposed on the interlayer insulation layer 150. The source electrode 160 and the drain electrode 162 may be electrically connected to the semiconductor layer 120 through a contact hole which is formed in the interlayer insulation layer 150 and the gate insulation layer 130. The source electrode 160 and the drain electrode 162 may include a single layer or layers of, for example, one or more materials selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu) by taking into account conductivity.

A passivation layer may be disposed covering the thin film transistor TFT to protect the thin film transistor TFT having the above-described structure. The passivation layer may be formed of, for example, an inorganic material such as silicon oxide, silicon nitride, and/or silicon oxynitride.

A planarization layer 170 may be disposed on the substrate 100. In this case, the planarization layer 170 may be a passivation layer. When the organic light-emitting device OLED is disposed on the thin film transistor TFT, the planarization layer 170 planarizes an entire upper surface of the thin film transistor TFT (e.g., the whole top of the thin film transistor TFT) and protects the thin film transistor TFT and various devices. The planarization layer 170 may be formed of an organic insulating material, and for example, may be formed of an acryl-based organic material and/or benzocyclobutene (BCB). As illustrated in FIG. 2, in one or more exemplary embodiments, the buffer layer 110, the gate insulation layer 130, the interlayer insulation layer 150, and the planarization layer 170 may be formed over an entire surface of the substrate 100 (e.g., over the whole substrate 100).

A pixel definition layer 180 may be disposed on the thin film transistor TFT. The pixel definition layer 180 may be disposed on the above-described planarization layer 170 and may have an opening. The pixel definition layer 180 may define a pixel area on the substrate 100.

The pixel definition layer 180 may be provided as, for example, an organic insulation layer. The organic insulation layer may include an acryl-based polymer such as poly (methyl methacrylate) (PMMA), polystyrene (PS), polymer derivatives containing a phenol group, an imide-based polymer, an aryl ether-based polymer, an amide-based polymer, a fluorine-based polymer, a p-xylene-based polymer, a vinyl alcohol-based polymer, and/or a compound thereof.

The organic light-emitting device OLED may be disposed on the pixel definition layer 180. The organic light-emitting device OLED may include a pixel electrode 210, an intermediate layer 220 including an emission layer (EML), and an opposite electrode 230.

The pixel electrode 210 may be formed as a semi-transparent electrode, a transparent electrode or a reflective electrode. When the pixel electrode 210 is formed as a semi-transparent electrode or a transparent electrode, the pixel electrode 210 may be formed of, for example, indium tin oxide (ITO), indium zinc oxide (IZO), zinc oxide (ZnO), indium oxide ($In_2O_3$), indium gallium oxide (IGO), and/or aluminum zinc oxide (AZO). When the pixel electrode 210 is formed as a reflective electrode, the pixel electrode 210 may include a reflective layer formed of Ag, Mg, Al, Pt, Pd, Au, Ni, Nd, Ir, Cr, and/or a compound thereof, and a layer formed of ITO, IZO, ZnO, $In_2O_3$, IGO, and/or AZO. However, the present invention is not limited thereto, and the pixel electrode 210 may be formed of various suitable materials. Also, a structure of the pixel electrode 210 may include a single layer or layers.

The intermediate layer 220 may be disposed in the pixel area defined by the pixel definition layer 180. The intermediate layer 220 may include the EML that emits light according to an electrical signal. In addition to the EML, a hole injection layer (HIL) disposed between the EML and the pixel electrode 210, an electron transport layer (ETL) disposed between the opposite electrode 230 and the HTL and EML, and/or an electron injection layer (EIL) may be stacked and formed in a single or complex structure. However, the intermediate layer 220 is not limited thereto, and may have various structures.

The intermediate layer 220 may be formed of a low-molecular weight organic material and/or a polymer organic material.

When the intermediate layer 220 includes a low-molecular weight organic material, an HTL, an HIL, an ETL, and/or an EIL may be stacked with respect to the EML, and the layers may be stacked in various suitable arrangements. The intermediate layer 220 may use, as an available organic material, various suitable materials such as copper phthalocyanine (CuPc), N,N'-Di(naphthalene-1-yl)-N,N'-diphenyl-benzidine (NPB), and/or tris-8-hydroxyquinoline aluminum (Alq3).

When the intermediate layer 220 includes a polymer organic material, an HTL in addition to the intermediate layer 220 may be provided. The HTL may use poly-(2,4)-ethylene-dihydroxy thiophene (PEDOT) and/or polyaniline (PANI). In this case, the intermediate layer 220 may use, as an available organic material, polymer organic materials such as a poly (p-phenylene vinylene) (PPV)-based polymer material and/or a polyfluorene-based polymer material. Also, in one or more exemplary embodiments, an inorganic material may be provided between the intermediate layer 220 and the pixel electrode 210 and the opposite electrode 230.

In one or more exemplary embodiments, the HTL, the HIL, the ETL, and/or the EIL may be formed as one body over the whole substrate 100, and only the EML may be formed in each pixel in an inkjet printing process. The HTL, the HIL, the ETL, and/or the EIL may be disposed in the pixel area.

The opposite electrode 230, which covers the intermediate layer 220 including the EML and opposite to the pixel electrode 210, may be disposed over the whole substrate 100. The opposite electrode 230 may be formed as a semi-transparent electrode, a transparent electrode or a reflective electrode.

When the opposite electrode 230 is formed as a semi-transparent or a transparent electrode, the opposite electrode 230 may include a layer formed of metal (e.g., Li, Ca, LiF/Ca, LiF/Al, Al, Ag, Mg, and a compound thereof) having a small work function and a semi-transparent or transparent conductive layer formed of ITO, IZO, ZnO, and/or $In_2O_3$. When the opposite electrode 230 is formed as a reflective electrode, the opposite electrode 230 may include a layer formed of Li, Ca, LiF/Ca, LiF/Al, Al, Ag, Mg, and/or a compound thereof. However, a structure and material of the opposite electrode 230 are not limited thereto, and may be variously modified in any suitable manner.

A metal layer 165 may be disposed at a distal end of the display 200. The metal layer 165 may be disposed on the same layer as that of the source electrode 160 and drain electrode 162 of the thin film transistor TFT, but in some embodiments the metal layer 165 may be disposed on the same layer as that of the gate electrode 140. The metal layer 165 may supply electrode power to the display 200. The metal layer 165 may be formed to extend to the dam 400, and as illustrated in FIG. 2, an edge of the metal layer 165 may be covered by the dam 400. The metal layer 165 may be exposed in the separation area SA (in other words, a portion of the metal layer 165 that is formed in the separation area SA may be exposed). In one or more exemplary embodiments, the metal layer 165 may not extend to the dam 400, and the edge of the metal layer 165 may be exposed in the separation area SA. As such, the metal layer 165 and at least a portion of the interlayer insulation layer 150 that is disposed under the metal layer 165 may be exposed in the separation area SA.

Referring to FIG. 2, in one or more exemplary embodiments, the organic light-emitting display apparatus may include the dam 400 which is disposed outside the display 200 and separated from the display 200 (e.g., separated from the display 200 by a predetermined distance). The dam 400 may have a similar multi-layer structure to that of the display 200. That is, the dam 400 may include a first layer 181, which extends in a direction parallel to the plane of the substrate 100 and includes an organic insulation material, and a second layer 182 which is disposed on the first layer 181 and includes the same material as that of the pixel definition layer 180. The first layer 181 of the dam 400 may include all or some of the layers included in the display 200. The dam 400 prevents or substantially prevents an organic layer 320 of the encapsulation layer 300 from being abnormally (or inadvertently) spread to an edge of the substrate 100.

The first layer 181 of the dam 400 may be formed of an organic insulation material, and in one or more embodiments, the first layer 181 may be formed in a multi-layer structure. In addition to the buffer layer 110 that is disposed over the whole display area DA, the gate insulation layer 130 and the interlayer insulation layer 150 may be disposed between the first layer 181 and the substrate 100. The second layer 182 including the same material as that of the pixel definition layer 180 may be disposed on the first layer 181.

Therefore, a height h1 of the dam 400 from the top of the substrate 100 to a top of the second layer 182 may be greater than a height h2 from the top of the substrate 100 to a top of the planarization layer 170. In other words, the height h1 of the dam 400 from the top of the substrate 100 to the top of the second layer 182 may be greater than the height h2 from the top of the substrate 100 to a bottom of the pixel definition layer 180.

The separation area SA may be formed between the display 200 and the dam 400 on the substrate 100, and, as illustrated in FIG. 2, the metal layer 165 may be exposed in the separation area SA. In one or more embodiments, the separation area SA may expose the substrate 100 and may expose the interlayer insulation layer 150 or the gate insulation layer 130 disposed under the metal layer 165. The groove 500, which corresponds to a space between the display 200 and the dam 400, may be formed in the separation area SA. The groove 500 may include a distal end side surface 200a of the display 200, a bottom 165a of the groove 500 where a portion of the buffer layer 110 or the substrate 100 is exposed in the separation area SA, and an inner surface 500a which includes a first side surface 400a of the dam 400 in a direction of the display 200.

Referring to FIG. 3, the organic light-emitting display apparatus is illustrated including the encapsulation layer 300. That is, the encapsulation layer 300 may be disposed on the display 200 of FIG. 2. The encapsulation layer 300 may cover the display 200 and include a first inorganic layer 310, an organic layer 320, and a second inorganic layer 330, which are sequentially disposed.

The first inorganic layer 310 may be disposed over the whole substrate 100 on the opposite electrode 230. The first inorganic layer 310 may cover an entire surface of the display 200 including the opposite electrode 230 and extend along the inner surface 500a of the groove 500. The first inorganic layer 310 may be disposed to cover the first side surface 400a of the dam 400 in the direction of the display 200, a second side surface 400b of the dam 400 opposite to the display 200, and a top 400c of the dam 400 (e.g., a first portion of the first inorganic layer 310 may cover the first side surface 400a of the dam 400, a second portion of the first inorganic layer 310 may cover the second side surface 400b of the dam 400, and a third portion of the first inorganic layer 310 may cover the top 400c of the dam 400).

The first inorganic layer 310 and the second inorganic layer 330 may be formed of an inorganic insulation material, and for example, may be formed of silicon nitride, aluminum nitride, zirconium nitride, titanium nitride, hafnium nitride, tantalum nitride, silicon oxide, aluminum oxide, titanium oxide, tin oxide, cerium oxide, and/or silicon oxynitride (SiON).

The organic layer 320 may be disposed on the first inorganic layer 310. The organic layer 320 may be formed of a liquid organic material, and for example, may be formed of acryl-based resin, methacrylate-based resin, polyisoprene, vinyl-based resin, epoxy-based resin, urethane-based resin, cellulose-based resin, perylene-based resin, and/or imide-based resin. An organic material may be applied to a panel through a deposition process, a printing process, and/or a coating process and may undergo a hardening process. When the organic material is hardened after the organic material is more broadly spread than an inorganic layer in a liquid state before hardening, the panel is shrunk by evaporation of moisture. Therefore, according to one or more exemplary embodiments of the present invention, the dam 400 prevents or substantially prevents a liquid organic material from being spread (or abnormally spread).

An end of the organic layer 320 may be buried or contained in the groove 500. The organic layer 320 may follow or correspond to any curves of structures that are formed on the substrate 100, and a top of the organic layer 320 may be substantially flat. Therefore, thicknesses of respective portions of the organic layer 320 may differ depending on shapes of the structures which are formed on the substrate 100. A first portion of the organic layer 320 disposed at or on the pixel definition layer 180 may have a first thickness t1, a second portion of the organic layer 320 at or in the separation area SA may have a second thickness t2, and a third portion of the organic layer 320 at or on an edge of the display 200 where the pixel definition layer 180 is not disposed may have a third thickness t3. The third thickness t3 may be greater than the first thickness t1 and less than the second thickness t2. The third thickness t3 corresponds to a portion (e.g., the third portion of the organic layer 320) that is disposed on the planarization layer 170, which is an insulation layer disposed at the edge of the display 200.

The second inorganic layer 330 may be disposed on the organic layer 320. The second inorganic layer 330 may cover the organic layer 320, and an end of the second inorganic layer 330 may be disposed on the first inorganic layer 310, which is disposed to cover a top of the dam 400 and a side surface opposite to the direction of the display 200 (e.g., a first portion of the second inorganic layer 330 may be disposed on the second portion of the first inorganic layer 310 that covers the second side surface 400b of the dam 400 and a second portion of the second inorganic layer 330 may be disposed on the third portion of the first inorganic layer 310 that covers the top 400c of the dam 400). A distal end of the second inorganic layer 330 may contact the substrate 200, and a sealing force is enhanced by a multi-layer structure of the first inorganic layer 310, the organic layer 320, and the second inorganic layer 330 of the encapsulation layer 300.

Generally, in manufacturing an organic light-emitting display apparatus, a display may be formed by using a mask. In depositing each layer of the display with the mask, because the mask may sag, scratches may occur due to contact between the mask and a pixel definition layer portion which protrudes the most from the display, thereby leaving particles on a surface of the mask. The particles are then transferred to another panel in a manufacturing process of forming a plurality of layers with one mask. When such an operation is repeated, the particles make the surface of the mask non-uniform, and scratches of the display are progressively deepened. Also, when the particles are of a certain size or larger, an encapsulation layer cannot normally seal the display due to the particles, and a defect is caused by external moisture. Particularly, in areas progressively closer to the edge of the display, the thickness of an organic layer of the encapsulation layer progressively decreases by the spread of an organic insulation material. Thus, a probability that particles attached to a planarization layer disposed at an edge of the display will cause a small defect increases.

Therefore, in the organic light-emitting display apparatus according to one or more exemplary embodiments of the present invention, the height of the dam 400 outside the display 200 may be higher than that of the planarization layer 170, and thus, the thickness of the organic layer disposed in the edge of the display 200 and the peripheral area PA of the substrate 100 may be formed relatively thick. Therefore, in a manufacturing process, particles attached to the edge of the display 200 may be buried or contained or deposited in the second portion of the organic layer 320 having the second thickness t2 or in the third portion of the organic layer 320 having the third thickness t3, thereby minimizing or reducing a defect of a sealing force of the encapsulation layer 300.

Figure 4:
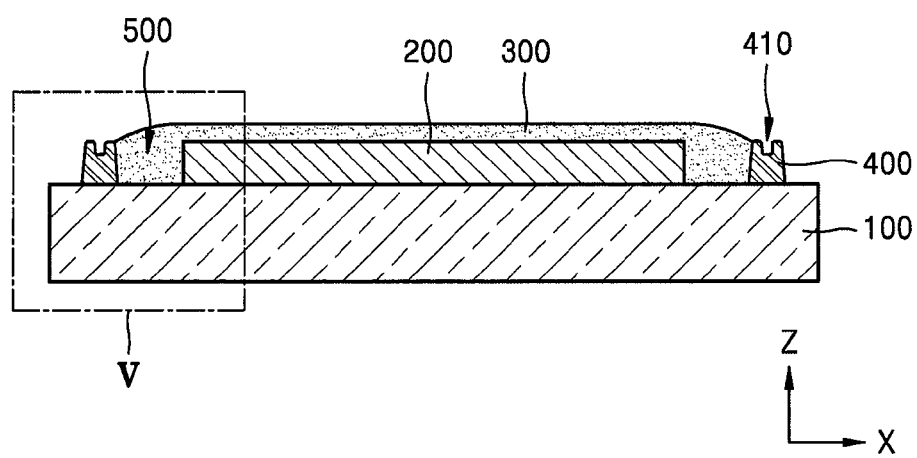
FIG. 4 is a cross-sectional view schematically illustrating an organic light-emitting display apparatus according to one or more exemplary embodiments.
Figure 5:
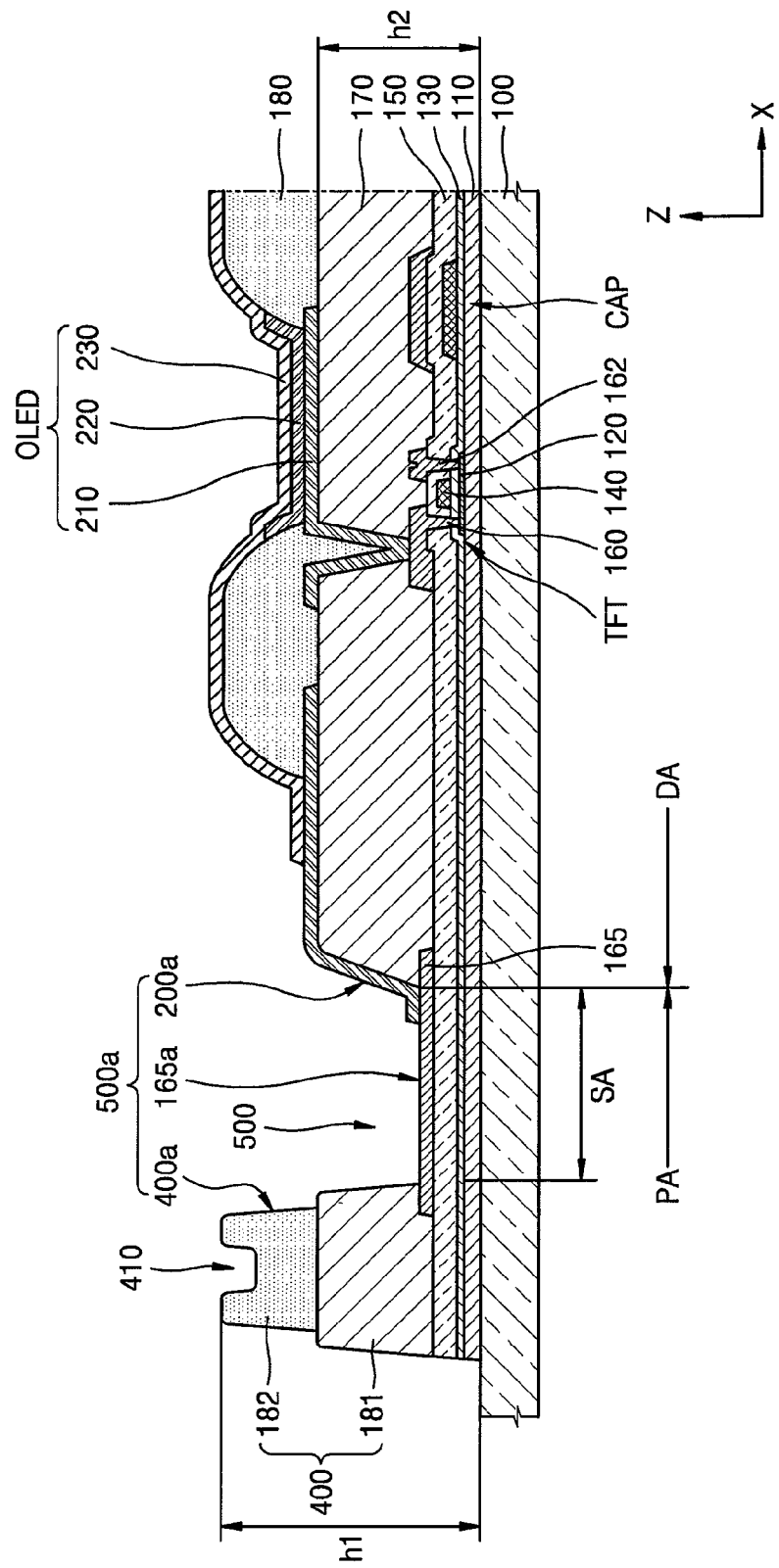
FIG. 5 is a cross-sectional view schematically illustrating a structure in region V of FIG. 4 in which an encapsulation layer is excluded.
Figure 6:
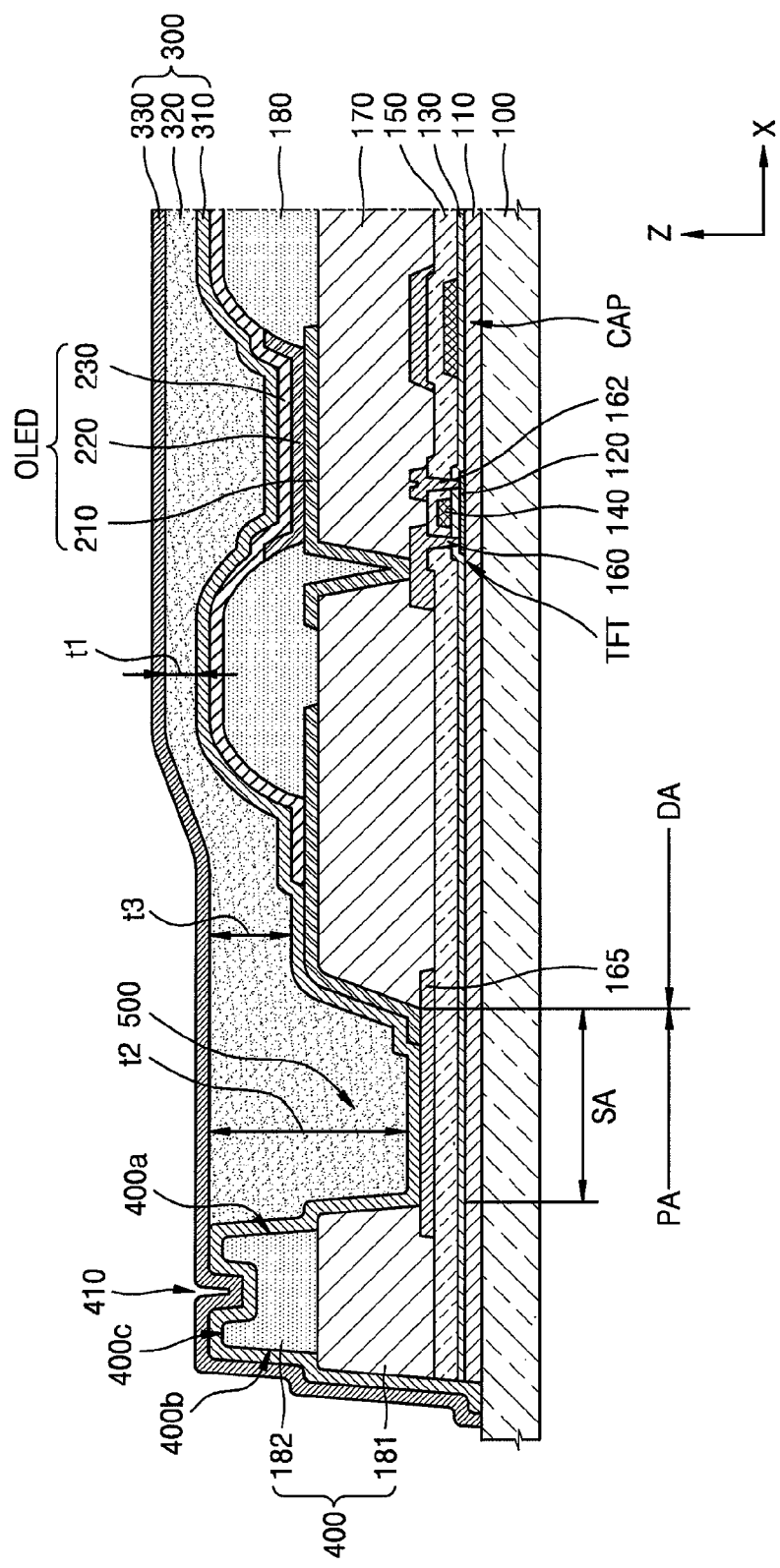
FIG. 6 is a cross-sectional view schematically illustrating a structure in the region V in which the encapsulation layer is included.

FIG. 4 is a cross-sectional view schematically illustrating an organic light-emitting display apparatus according to one or more exemplary embodiments of the present invention. FIG. 5 is an enlarged cross-sectional view schematically illustrating a structure in region V of FIG. 4 in which an encapsulation layer 300 is excluded. FIG. 6 is an enlarged cross-sectional view schematically illustrating a structure in the region V of FIG. 4 in which the encapsulation layer 300 is included.

Referring to FIGS. 4 to 6, the organic light-emitting display apparatus according to one or more exemplary embodiments may include a substrate 100, a display 200 disposed on the substrate 100, the encapsulation layer 300 disposed on the display 200, a dam 400, which is disposed outside the display 200 and includes a recessed portion 410 at a top of the dam 400, and a groove 500 in a separation area SA between the display 200 and the dam 400. The structures of various elements of the organic light-emitting display according to the above-described embodiment of FIGS. 1 to 3 are the same or substantially the same, with the exception of the dam 400. As such, repeated description of like elements is omitted below.

According to one or more exemplary embodiments, the dam 400 may be disposed outside the display 200 and separated from the display 200 (e.g., separated from the display 200 by a predetermined distance). The dam 400 may have a similar multi-layer structure to that of the display 200. That is, the dam 400 may include a first layer 181, which is disposed in a direction of the substrate 100 including an organic insulation material, and a second layer 182 which is disposed on the first layer 181 and includes the same material as that of the pixel definition layer 180. The first layer 181 of the dam 400 may include all or some of the layers included in the display 200. The dam 400 prevents an organic layer 320 of the encapsulation layer 300 from being abnormally spread to an edge of the substrate 100.

The first layer 181 of the dam 400 may be formed of an organic insulation material, and in some embodiments, the first layer 181 may be formed in a multi-layer structure. In addition to the buffer layer 110 disposed over the whole display area DA, the gate insulation layer 130 and the interlayer insulation layer 150 may be disposed between the first layer 181 and the substrate 100. The second layer 182 including the same material as that of the pixel definition layer 180 may be disposed on the first layer 181.

Therefore, a height h1 of the dam 400 from the top of the substrate 100 to a top of the second layer 182 may be greater than a height h2 from the top of the substrate 100 to a top of the planarization layer 170. In other words, the height h1 of the dam 400 from the top of the substrate 100 to the top of the second layer 182 may be greater than the height h2 from the top of the substrate 100 to a bottom of the pixel definition layer 180. In one or more embodiments, a spacer may be further disposed on the second layer 182.

The recessed portion 410 may be formed in a top 400c of the dam 400. Because the recessed portion 410 is formed in the top 400c of the dam 400, the organic layer 320 is prevented or substantially prevented from passing over the dam 400 and spreading (e.g., abnormally or inadvertently spreading) to outside the dam 400.

The separation area SA may be formed between the display 200 and the dam 400 on the substrate 100 and may expose the buffer layer 110. However, in some embodiments, the separation area SA may expose the substrate 100. The groove 500, which corresponds to a space between the display 200 and the dam 400, may be formed in the separation area SA. An inner surface 500a of the groove 500 may include a distal end side surface 200a of the display 200, a bottom 165a corresponding to the separation area SA (e.g., where a portion of the buffer layer 110 or the substrate 100 is exposed in the separation area SA), and a first side surface 400a of the dam 400. The inner surface 500a of the groove 500 may extend in a direction of the display 200.

The encapsulation layer 300 may be disposed on the display 200. The encapsulation layer 300 may cover the display 200 and may include a first inorganic layer 310, an organic layer 320, and a second inorganic layer 330, which are sequentially disposed.

The first inorganic layer 310 may be disposed over the whole substrate 100 on the opposite electrode 230. The first inorganic layer 310 may cover an entire surface of the display 200 including the opposite electrode 230 and may extend along the inner surface 500a of the groove 500. The first inorganic layer 310 may be disposed to cover the first side surface 400a of the dam 400 in the direction of the display 200, a second side surface 400b of the dam 400 opposite to the display 200, and a top 400c of the dam 400. Also, the first inorganic layer 310 may be disposed in the recessed portion 410 which is disposed on the top 400c of the dam 400.

The first inorganic layer 310 and the second inorganic layer 330 may be formed of an inorganic insulation material, and for example, may be formed of silicon nitride, aluminum nitride, zirconium nitride, titanium nitride, hafnium nitride, tantalum nitride, silicon oxide, aluminum oxide, titanium oxide, tin oxide, cerium oxide, and/or silicon oxynitride (SiON).

The organic layer 320 may be disposed on the first inorganic layer 310. The organic layer 320 may be formed of a liquid organic material, and for example, may be formed of acryl-based resin, methacryl-based resin, polyisoprene, vinyl-based resin, epoxy-based resin, urethane-based resin, cellulose-based resin, perylene-based resin, and/or imide-based resin. An organic material may be applied to a panel through a deposition process, a printing process, and/or a coating process and may undergo a hardening process. When the organic material is hardened after the organic material is more broadly spread than an inorganic layer in a liquid state before hardening, the panel is shrunk by evaporation of moisture. Therefore, according to one or more exemplary embodiments of the present invention, the dam 400 prevents or substantially prevents a liquid organic material from being spread (e.g., abnormally or inadvertently spread).

An end of the organic layer 320 may be buried or contained in the groove 500. The organic layer 320 may follow or correspond to any curves of structures that are formed on the substrate 100, and a top of the organic layer 320 may be substantially flat. Therefore, thicknesses of respective portions of the organic layer 320 may differ depending on shapes of the structures which are formed on the substrate 100. A first portion of the organic layer 320 disposed at or on the pixel definition layer 180 may have a first thickness t1, a second portion of the organic layer 320 disposed at or in the separation area SA may have a second thickness t2, and a third portion of the organic layer 320 at or on an edge of the display 200 where the pixel definition layer 180 is not disposed may have a third thickness t3. The third thickness t3 may be greater than the first thickness t1 and less than the second thickness t2. The third thickness t3 corresponds to a portion (e.g., the third portion of the organic layer 320) that is disposed on an insulation layer which is disposed at the edge of the display 200.

The end of the organic layer 320 may be formed to a height of the dam 400, and in some embodiments, a portion of the organic layer 320 may be disposed in the recessed portion 410. As such, an organic material that may pass over the dam 400 when forming the organic layer 320 may be disposed in the recessed portion 410.

The second inorganic layer 330 may be disposed on the organic layer 320. The second inorganic layer 330 may cover the organic layer 320, and an end of the second inorganic layer 330 may be disposed on the first inorganic layer 310, which is disposed to cover a top of the dam 400 and a side surface opposite to the direction of the display 200 (e.g., a first portion of the second inorganic layer 330 may be disposed on the second portion of the first inorganic layer 310 that covers the second side surface 400b of the dam 400 and a second portion of the second inorganic layer 330 may be disposed on the third portion of the first inorganic layer 310 that covers the top 400c of the dam 400). A distal end of the second inorganic layer 330 may contact the substrate 200, and a sealing force is enhanced by a multi-layer structure of the first inorganic layer 310, the organic layer 320, and the second inorganic layer 330 of the encapsulation layer 300.

The present invention is also directed to a method of manufacturing an organic light-emitting display apparatus.

First, an operation of forming the display 200 on the substrate 100 may be performed. The display 200 may include the thin film transistor TFT, the capacitor CAP, and the organic light-emitting device OLED that is electrically connected to the thin film transistor TFT. The operation of forming the display 200 may include forming the thin film transistor TFT on the substrate 100 and then forming the pixel electrode that is electrically connected to the thin film transistor TFT. Subsequently, the operation of forming the display 200 may include forming the pixel definition layer, which covers an edge of the pixel electrode and exposes a portion (e.g., a center portion) of the pixel electrode, and forming the intermediate layer, which includes the EML, on the center portion of the pixel electrode exposed by the pixel definition layer. The operation of forming the display 200 may include forming the opposite electrode, which is opposite to the pixel electrode, over the whole substrate 100 and on the intermediate layer. The above-described details of FIG. 2 are repetitive of a detailed manufacturing process and a configuration of the display 200 which includes the thin film transistor TFT and the organic light-emitting device OLED. Accordingly, additional description thereof is omitted herein.

An operation of forming the dam 400, which has a multi-layer structure, outside the display 200 and separated from the display 200 may be performed. The dam 400 may be concurrently formed with the operation of forming the display 200. The dam 400 may be formed of the layers included in the display 200. The dam 400 may undergo an operation of forming the first layer 181 in a direction of the substrate 100 and then undergo an operation of forming the second layer 182, which includes the same material as that of the pixel definition layer 180, on the first layer 181. The first layer 181 may have a multi-layer structure.

The height h1 of the dam 400 may be greater than the height h2 of the planarization layer 170. In other words, a height from the top of the substrate 100 to the top of the dam 400 may be greater than the height h2 from the top of the substrate 100 to the bottom of the pixel definition layer 180. The spacer may be further disposed on the second layer 182. The separation area SA may be formed between the display 200 and the dam 400 on the substrate 100, and as illustrated in FIG. 2, the separation area SA may expose the metal layer 165. In some embodiments, the separation area SA may expose the substrate 100 and expose the interlayer insulation layer 150 or the gate insulation layer 130 disposed under the metal layer 165. The groove 500, which corresponds to a space between the display 200 and the dam 400, may be formed in the separation area SA. The inner surface 500a of the groove 500 may include the distal end side surface 200a of the display 200, the bottom 165a corresponding to the separation area SA (e.g., where a portion of the buffer layer 110 or the substrate 100 is exposed in the separation area SA), and the first side surface 400a of the dam 400. The inner surface 500a of the groove 500 may extend in a direction of the display 200.

Subsequently, an operation of forming the encapsulation layer 300, which covers the display 200 and is buried or contained in the groove 500 formed between the display 200 and the dam 400, may be performed. The operation of forming the encapsulation layer 300 may include an operation of forming the first inorganic layer 310, an operation of forming the organic layer 320 on the first inorganic layer 310, and an operation of forming the second inorganic layer 330 on the organic layer 320.

The first inorganic layer 310 may be formed over the whole substrate 100 and on the opposite electrode to cover the display 200, and may extend along the inner surface 500a of the groove 500, which is formed in the separation area SA between the display 200 and the dam 400. The end of the first inorganic layer 310 may be formed to cover the first side surface 400a of the dam 400 in the direction of the display 200, the second side surface 400b of the dam 400 opposite to the display 200, and the top 400c of the dam 400.

Subsequently, the organic layer 320 may be formed on the first inorganic layer 310, and the end of the organic layer 320 may be buried or contained in the groove 500. The organic layer 320 may correspond to any curves of structures that are formed on the substrate 100, and a top of the organic layer 320 may be substantially flat. Therefore, thicknesses of respective portions of the organic layer 320 may differ depending on shapes of the structures which are formed on the substrate 100. The first portion of the organic layer 320 disposed at or on the pixel definition layer 180 may have the first thickness t1, the second portion of the organic layer 320 disposed in or at the separation area SA may have the second thickness t2, and the third portion of the organic layer 320 disposed at or on an edge of the display 200 where the pixel definition layer 180 is not disposed may have the third thickness t3. As such, the third thickness t3 may be greater than the first thickness t1 and less than the second thickness t2. The third thickness t3 corresponds to a portion (e.g., the third portion of the organic layer 320) that is disposed on an insulation layer which is disposed at the edge of the display 200.

The second inorganic layer 330 may be disposed on the organic layer 320. The second inorganic layer 330 may cover the organic layer 320, and the end of the second inorganic layer 330 may be disposed on the first inorganic layer 310, which is disposed to cover the top of the dam 400 and a side surface opposite to the direction of the display 200 (e.g., a first portion of the second inorganic layer 330 may be disposed on the second portion of the first inorganic layer 310 that covers the second side surface 400b of the dam 400 and a second portion of the second inorganic layer 330 may be disposed on the third portion of the first inorganic layer 310 that covers the top 400c of the dam 400). The distal end of the second inorganic layer 330 may contact the substrate 200, and a sealing force is enhanced by a multi-layer structure of the first inorganic layer 310, the organic layer 320, and the second inorganic layer 330 of the encapsulation layer 300.

Generally, in manufacturing an organic light-emitting display apparatus, a display may be formed by using a mask. In depositing each layer of the display with the mask, because the mask may sag, scratches may occur due to contact between the mask and a pixel definition layer portion which protrudes the most from the display, thus leaving particles on a surface of the mask. The particles are transferred to another panel in a manufacturing process of forming a plurality of layers with one mask. When such an operation is repeated, the particles make the surface of the mask non-uniform, and a scratch or scratches of the display 200 are progressively deepened. Also, when the particles are of a certain size or larger, an encapsulation layer cannot normally seal the display due to the particles, and a defect is caused by external moisture. Particularly, in areas progressively closer to the edge of the display, the thickness of an organic layer of the encapsulation layer progressively decreases by the spread of an organic insulation material. Thus, a probability that particles attached to a planarization layer disposed at an edge of the display will cause a small defect increases.

Therefore, in the organic light-emitting display apparatus according to one or more exemplary embodiments of the present invention, the height of the dam 400 outside the display 200 may be higher than that of the planarization layer 170, and thus, a thickness of the organic layer disposed in the edge of the display 200 and the peripheral area PA of the substrate 100 may be formed relatively thick. Therefore, in a manufacturing process, particles attached to the edge of the display 200 may be buried or contained or deposited in the second portion of the organic layer 320 having the second thickness t2 or in the third portion of the organic layer 320 having the third thickness t3, thereby minimizing or reducing a defect of a sealing force of the encapsulation layer 300.

As described above, according to the one or more of the above exemplary embodiments, an organic light-emitting display apparatus with an enhanced sealing force and a method of manufacturing the same are implemented.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. An organic light-emitting display apparatus comprising:
 a substrate having a display area and a peripheral area surrounding the display area;
 a display unit on the substrate in the display area, the display unit comprising:
 a first thin film transistor and a capacitor on the substrate;
 an insulating layer on the first thin film transistor and the capacitor;
 a pixel electrode on the insulating layer and electrically connected to the first thin film transistor;
 a pixel definition layer covering an edge of the pixel electrode and exposing a portion of the pixel electrode;
 an intermediate layer on the pixel electrode, the intermediate layer comprising an emission layer; and
 an opposite electrode opposite the pixel electrode; and
 a dam in the peripheral area, the dam having a first layer comprising a same material as that of the insulating layer, and a second layer on the first layer and comprising a same material as that of the pixel definition layer,
 wherein the insulating layer is interposed between the first thin film transistor and the pixel electrode.

2. The organic light-emitting display apparatus of claim 1, further comprising:
   a metal layer on a side of the display unit, the metal layer being configured to supply power to the display unit,
   wherein the metal layer extends to the first layer of the dam.

3. The organic light-emitting display apparatus of claim 2, wherein an edge of the metal layer is covered by the first layer of the dam.

4. The organic light-emitting display apparatus of claim 2, further comprising:
   an insulation layer under the metal layer; and
   a groove in a separation area between the display unit and the dam;
   wherein the separation area exposes the metal layer or the insulation layer.

5. The organic light-emitting display apparatus of claim 1, further comprising:
   an encapsulation layer comprising a first inorganic layer, a second inorganic layer, and an organic layer between the first inorganic layer and a second inorganic layer, wherein the first inorganic layer and the second inorganic layer are on the second layer of the dam.

6. The organic light-emitting display apparatus of claim 5, wherein an edge of the first inorganic layer extends to an edge of the substrate and covers the dam.

7. The organic light-emitting display apparatus of claim 5, wherein a top surface of the organic layer is substantially flat in the separation area.

8. The organic light-emitting display apparatus of claim 5, wherein the first inorganic layer and the second inorganic layer directly contact each other on the second layer.

9. The organic light-emitting display apparatus of claim 1, wherein the first layer extends in a direction parallel to a plane of the substrate.

10. The organic light-emitting display apparatus of claim 1, wherein the second layer of the dam comprises a recessed portion at the top of the dam.

* * * * *